United States Patent [19]

Vinden et al.

[11] Patent Number: 5,024,861

[45] Date of Patent: Jun. 18, 1991

[54] GASEOUS OR VAPOR PHASE TREATMENT OF WOOD WITH BORON PRESERVATIVES

[75] Inventors: Peter Vinden, Tarawera; Russell J. Burton; Timote M. Vaioleti, both of Rotorua, all of New Zealand

[73] Assignee: Her Majesty the Queen In Right of New Zealand Acting by and Through the Minister of Forestry for New Zealand, Wellington, New Zealand

[21] Appl. No.: 210,638

[22] Filed: Jun. 23, 1988

[30] Foreign Application Priority Data

Jun. 23, 1987 [NZ] New Zealand ........................ 216746

[51] Int. Cl.[5] ........................ C23C 16/28; B05D 3/02; B05D 3/04

[52] U.S. Cl. ................................. 427/254; 427/255.1; 427/255.2; 427/255.3; 427/314; 427/317; 427/325; 427/377; 427/393; 427/393.3; 427/397

[58] Field of Search .................. 427/254, 255.1, 255.2, 427/255.3, 351, 393, 393.3, 397, 377, 317, 325; 428/537.1, 541, 704

[56] References Cited

U.S. PATENT DOCUMENTS

| | | | |
|---|---|---|---|
| 374,208 | 12/1887 | Sewall | 427/325 |
| 2,633,429 | 3/1953 | Hudson | 427/254 |
| 2,655,454 | 10/1953 | Farber et al. | 427/325 |
| 3,342,629 | 9/1967 | Martin | 427/325 |
| 3,438,847 | 4/1969 | Chase | 427/397 |
| 4,303,726 | 12/1981 | Turner | 427/397 |
| 4,354,316 | 10/1982 | Schroeder | 34/13.8 |
| 4,373,010 | 2/1983 | Oberley | 427/397 |
| 4,413,023 | 11/1983 | Chow | 427/325 |
| 4,620,990 | 11/1986 | Dicker | 427/325 |

FOREIGN PATENT DOCUMENTS

| | | | |
|---|---|---|---|
| 59-70503 | 4/1984 | Japan | 427/351 |
| 115464 | 1/1959 | New Zealand . | |
| 412175 | 7/1934 | United Kingdom . | |

OTHER PUBLICATIONS

Vinden, "Options For Accelerated Boron Treatment: A Practical Review of Alternatives", pp. 16–21 (May 1985).

*Primary Examiner*—Norman Morgenstern
*Assistant Examiner*—Margaret Bueker

[57] ABSTRACT

The invention comprises a process for the preservation of timber with a boron based compound, such as trimethyl borate. The timer is dried to a low moisture content, is then subjected to a vapor of the boron compound in a suitable treatment vessel, and after vapor treatment is steam conditioned to return the moisture content of the timber to a normal working level. The vapor treatment is preferably carried out under heat and reduced pressure. Timber preserved by the process is also claimed.

19 Claims, No Drawings

GASEOUS OR VAPOR PHASE TREATMENT OF WOOD WITH BORON PRESERVATIVES

Compounds of boron have been used as preservatives for timber for many years. Typically such compounds of boron are applied to timber to be treated by dipping of the timber in a bath or the like comprising an aqueous solution of the boron compound. After dipping the timber must remain under non-drying conditions for sufficient time for the boron to diffuse into the timber, which can be of the order of weeks or some months, and thus the preservative process is relatively time consuming. In commercial terms it is desirable to minimise standing time for timber stocks.

Some compounds of boron are either low boiling point liquids or gases. When placed in contact with timber or wood-based products, selected compounds undergo chemical reaction with the wood or residual wood moisture whereby boron as compounds of boron is deposited in the timber. For example, on contact with wood trimethyl borate reacts, it is believed with wood moisture, to deposit boron in the wood material as boric acid. The preservative treatment of timber with a boron compound in the vapor phase has previously been proposed but due to practical difficulties is believed not to have been employed commercially.

The present invention provides an improved or at least alternative process for the vapor or gas phase boron preservation treatment of timber.

In broad terms the invention may be said to comprise a process for the preservative or remedial treatment of timber or wood based products with a boron based preservative, comprising the steps of drying the timber to a reduced moisture content, exposing the timber to a vapor or gas of a boron compound whereby boron or a compound of boron becomes deposited within the wood material, and subjecting the timber to conditioning to attain a working moisture content therefor.

In the process of the invention which comprises drying prior to preservative treatment and subsequent conditioning, boron preservation treatment of timber may be carried out more rapidly than with conventional boron dipping processes. Immediately or in a relatively short time after processing the timber is in a suitable condition for use or sale, and standing of the timber for long periods after treatment as in conventional boron preservative treatment processes is not required. The process of the invention is particularly suitable for the preservative treatment of sawn timber intended for dry framing or the like, since the final conditioning step of the preservative process may be carried out such that the timber after treatment has the appropriate moisture content and/or drying stresses in the timber are relieved.

Preferably all the treatment steps of the preservative process of the invention are carried out within a common treatment plant such as a common suitable closed treatment vessel or the like, but it is possible for drying and conditioning to be carried out in an existing drying and conditioning plant with vapor/gas treatment being carried out in a separate preservation vessel, for example, or further for all of the drying, vapor/gas treatment, and conditioning to be carried out separately in individual plant, although treatment in a common vessel or plant is most preferred since it minimises handling of the timber in transfer from one plant to another and enables more rapid treatment.

Preferably the vapor/gas treatment is carried out in the treatment vessel under conditions of reduced pressure or relative vacuum, and elevated temperature, but treatment could be carried out under elevated pressure conditions or alternating pressure and/or vacuum and/or exposure to atmospheric pressure, in combination with heating and/or cooling, or the like.

Preferably the drying before vapor/gas treatment comprises high temperature drying, but other drying techniques may be employed such as conventional drying up to temperatures of 100° C., vapor recompression drying, vacuum drying, or radio-frequency drying, for example, or air drying.

Preferably in the drying the moisture content of the timber is reduced to below of the order of 6% by weight and preferably to a level of of the order of 2% of the oven dry weight of the wood. Reduction of the timber moisture content to these levels enables more efficient deposit of the boron, or compounds in which the boron is present, during the vapor/gas treatment in terms of the volume of consumption of the vaporised boron compound, with a better distribution of the boron through the cross-sectional area of the wood. The vapor/gas treatment can be carried out at higher wood moisture contents but at higher moisture levels consumption of the vaporised boron compound is increased and deposit of boron in or towards the core of the wood material is not optimised.

Suitably the conditioning after vapor/gas treatment comprises steam conditioning. Conditioning may be carried out at or at about atmospheric pressure, and typically conditioning may be carried out to attain a working moisture content in the range 8 to 12% by weight of the oven dry wood and optimumly of the order of 10% for the wood, or to such other level as may be required for any particular end use of the timber.

Boron compounds which may be employed in the vapor/gas treatment comprise any suitable compound of boron that will deposit boron as a compound or compounds of boron in the wood material including trimethyl borate, methyldiborane, trimethylborane, dimethyldiborane, trimethyldiborane, borine carbonyl, for example, or any other suitable boron compound including azeotropes or mixtures of these compounds with other compounds such as methanol or other suitable solvents, for example. Compounds may be selected having regard to their flammability/stability, reactivity with wood or wood moisture, and toxicity. A preferred compound is trimethyl borate or a combination of trimethyl borate and methanol at or at about the azeotropic composition thereof.

In accordance with the process of the invention the timber is firstly dried to reduce the moisture content thereof to a predetermined level, preferably less than 6% and preferably of the order of 2% by weight. High temperature drying, to reduce the moisture content of the wood to approximately 2% is preferred. Preferably of the order of 90% of the timber is reduced to below 6% moisture content prior to vapor/gas treatment, and a typical high temperature drying schedule involves a dry bulb temperature of 120° C. and a wet bulb temperature of 70° C. and a drying time of approximately 24 hours, for say 100×50 mm Radiata Pine filleted every layer. Other variations of temperatures and time will achieve a similar wood moisture content, or other desired moisture contents. Any suitable drying schedule to achieve a desired wood moisture content prior to vapor/gas treatment for any particular wood species or type may be employed.

Drying is preferably carried out in a common vapor/-gas treatment vessel. An existing closed liquid preservative treatment vessel may be adapted for carrying out the process of the invention by incorporating a heating system to effect the drying operation, fans to circulate the drying medium, pumps for evacuation for vapor treatment, and conditioning facilities or the like, and suitable control systems.

After drying the timber is subjected to a vapor or gas of the selected boron compound and the vapor/gas treatment is carried out in a suitable closed vessel which as stated is preferably the common drying and conditioning vessel. A further advantage of a common vessel is that apart from minimising handling of the timber and the like, the boron vapor/gas treatment may take place immediately the timber is dry enough and the timber will be hot after drying which minimises condensation of the vapor onto the outside surfaces of the wood and assists vapor or gas movement into the wood.

Treatment is carried out at a sufficient temperature to sustain the boron compound vapor or gas. Preferably both the timber and the treatment vessel are heated to a temperature such that condensation of the vapor onto the wood and walls of the vessel is minimised. Heating of the timber to high temperatures for such periods as will result in degradation of the timber should however be avoided. Temperatures of greater than 80° C. and typically in the range 80° to 120° C. are preferred.

As referred to, preferably vapor or gas treatment is carried out in an evacuated treatment vessel. The vessel may be substantially fully or partially evacuated. The vessel may be evacuated to within the range 50 kPa (absolute) to approaching full vacuum, for example, and preferably to substantially 15 kPa (absolute).

After initial exposure of the timber to the vaporised/-gas boron compound the timber may be left in contact with the vapor/gas for of the order of minutes to hours before evacuation of the remaining vapor and any by products from the treatment vessel. If trimethyl borate is heated to 200° C. prior to application, for example, and the timber to be treated to 80° C. and the treatment vessel then evacuated, treatment can be completed within of the order of thirty minutes.

The boron compound vapor may be created by boiling of the liquid boron compound in a separate vessel and venting of the vapor into the treatment vessel, or preferably the boron compound vapor is created by heating the treatment vessel to a sufficient temperature and/or evacuating the treatment vessel to a sufficient reduced pressure and injecting the liquid boron compound into the treatment vessel, the temperature and pressure being suficient to cause the liquid boron compound to vaporise on entry to the treatment vessel. This has the advantage that the rate of exposure of the timber to the boron compound and the volume of the boron compound are readily controlled. Where the vapor is created separately and vented into the treatment vessel preferably the vapor/gas is heated to a higher temperature than the wood where at least partial evacuation of the treatment vessel is employed, because when the vapor or gas is released into the evacuated treatment vessel there a temperature reduction occurs.

After drying and vapor/gas treatment the timber is conditioned and steam conditioning is preferably employed. Conditioning for a period of about 2 hours per 25 mm of thickness of individual wood pieces is preferred. Typically conditioning may be carried out to attain a working moisture content in the range 8 to 12% and most typically of the order of 10% by weight of the oven dry weight of the wood, or to such other level as may be required for any particular end use of the timber.

Examples of the process of the invention are given below:

EXAMPLE 1

A stack of freshly-sawn timber was filleted every layer and placed in a closed treatment vessel which was then heated to 120° C. dry-bulb and 70° C. wet bulb temperature. The differential between the wet and dry bulb temperatures was maintained by venting to atmosphere. Once the average wood moisture content was 4%, the cylinder was sealed and evacuated to 15 kPa (absolute). While the vessel was being evacuated, trimethyl borate liquid was measured into a boiler. The volume of liquid decanted was proportional to the volume of timber being dried and equated to approximately 3.2 kg boric acid equivalent per $m^3$ of wood. The liquid was heated to 200° C. After 10 minutes evacuation at 15 kPa (absolute), the valve separating the super heated trimethyl borate from the treatment vessel was opened to effect treatment. Within 2–3 minutes the treatment vessel vacuum gauge returned from approximately 110 kPa (absolute) to approximately 30 kPa (absolute). The treatment vessel was then evacuated to 15 kPa (absolute) for 5 minutes. Steam was then applied for two hours to increase the moisture content of the wood to 10–12%. The treated wood was subsequently removed from the treatment vessel.

EXAMPLE 2

Ten pieces of wood (nominally 100 mm×50 mm×600 mm) were high temperature dried at wet bulb 70° C. and dry bulb 140° C. temperatures for about 24 hours. Then 200 mm samples were cut from each for moisture determinations. The moisture content MC (on oven dry basis) averaged 4.6%. The wood was transferred to a preheated pressure vessel of about 50 liters volume. The wood was filletted every layer in a similar fashion to the stacking in the drying operation. The vessel was sealed and evacuated to 15 kPa (absolute) and held at this level for a further 10 minutes. Then 380 ml of trimethyl borate - methanol azeotrope in liquid form was injected into the vessel in a time of 37 seconds. The TMB/methanol mixture was sprayed onto the inside of the pressure vessel shell which was at a temperature of about 120° C. This caused the TMB/methanol to vaporise and effected the treatment of the wood. During the injection the pressure in the vessel increased to near atmospheric but then slowly decreased to settle at about 90 kPa (absolute). The system remained under these conditions for a further 5 minutes. After 10 minutes the pressure vessel was directly vented to atmosphere; the vessel opened and the dried and treated wood was removed. Steam was then admitted into the vessel at atmospheric pressure for four hours to increase the moisture content of the wood to 10–12%.

The treated wood was examined and analysed. The retention of preservative in the cross sectional area of the wood ranged from 0.4% w/w Boric acid equivalent (BAE) to 0.8% and averaged 0.6% w/w/BAE. The central one - ninth of the cross sectional area ranged from 0.1 to 0.5% w/w BAE with an average of 0.3% w/w BAE.

EXAMPLE 3

Wood was treated as in Example 2 except that during boron vapor treatment the treatment vessel was evacuated to 10 kPa (absolute) prior to injection of the boron liquid, and 300 ml of trimethyl borate was injected in in a time of about 30 seconds. The pressure in the vessel increased to 60 kPa (absolute) and then dropped back to 55 kPa (absolute) during liquid injection.

The treated wood was examined and analysed. The retention of preservative in the cross sectional area of the wood ranged from 0.5% w/w Boric acid equivalent (BAE) to 0.7% and averaged 0.6% w/w BAE. The central one - ninth of the cross sectional area ranged from 0.1 to 0.6% w/w BAE with an average of 0.4% w/w BAE.

EXAMPLE 4

Thirty pieces of freshly cut wood (Radiata Pine): 20 pieces of sapwood and 10 pieces of heartwood, of nominally 100 mm×50 mm×2.4 m were high temperature dried at 120° C. dry bulb and 70° C. wet bulb for about 24 hours. Immediately following the drying operation 400 mm samples were cut from each for moisture content determination. The moisture content of the heartwood ranged from 2.00% (OD basis) to 3.37% with an average of 2.44%. The moisture content of the sapwood ranged from 2.86% to 8.59% with an average of 4.79%. The wood was then placed into a hot (about 110° C.) pressure vessel of nominal volume 1 cu.m. The wood was fully filletted and stacked into this vessel in an identical manner to that in which it was dried. The vessel was sealed and evacuated to a pressure of about 38 kPa (absolute). Then 3.5 liters of the preservative was injected into the vessel split between three injectors equally spaced along the inside top of the pressure vessel. Injection time was 3 minutes. The preservative was trimethyl borate - methanol near the azeotropic composition, at a boric acid equivalent composition of 36.6% w/v. Following injection the pressure increased to 77 kPa (absolute) and then slowly reduced to about 69 kPa (absolute). Steam conditioning was then initiated. Steam was slowly admitted into the vessel. When atmospheric pressure was reached the vessel was directly vented to atmosphere so that the internal pressure was held within 3 kPa of atmospheric pressure. This was continued for four hours to increase the moisture content of the wood to 10–12%. Following completion of the steam conditioning stage the steam was shut off and the vessel opened and the dried, treated wood removed.

The treated wood was examined and analysed. The retention of preservative in the cross sectional area of the heartwood ranged from 0.109% w/w Boric acid equivalent (BAE) to 0.404% with a standard deviation of 0.09, and averaged 0.314% w/w BAE. The central one - ninth of the cross sectional area of the heartwood ranged from 0.002 to 0.442% w/w BAE with a standard deviation of 0.13 and with an average of 0.28% w/w BAE. The retention of preservative in the cross-sectional area of the sap wood ranged from 0.401% w/w Boric acid equivalent (BAE) to 0.672% with a standard deviation of 0.08 and averaged 0.52% w/w BAE. The central one - ninth of the cross sectional area ranged from 0.011 to 0.354% w/w BAE with a standard deviation of 0.10 and an average of 0.22 w/w BAE.

EXAMPLE 5

Thirty pieces of freshly cut wood (Radiata Pine): 20 pieces of sapwood and 10 pieces of heartwood, of nominally 100 mm×50 mm×2.5 m were high temperature dried at 120° C. dry bulb and 70° C. wet bulb for about 24 hours. Immediately following the drying operation 400 mm samples were cut from each for moisture content determination. The moisture content of the heartwood ranged from 2.10% (OD basis) to 4.38% with an average of 2.82%. The moisture content of the sapwood ranged from 5.44% to 17.66% with an average of 10.49%. The wood was then placed into a hot (about 110° C.) pressure vessel of nominal volume 1 cu.m. The wood was fully filletted and stacked into this vessel in an identical manner to that in which it was dried. The vessel was sealed and evacuated to a pressure of about 21 kPa (absolute). Then 2.5 liters of the preservative was injected into the vessel split between three injectors equally spaced along the inside top of the pressure vessel. Injection time was 1 minute 15 seconds. The preservative was trimethyl borate and methanol near the azeotropic composition, at a boric acid equivalent composition of 36.6% w/v. Following injection of the preservative the pressure increased to 54 kPa (absolute) and then slowly reduced to about 40 kPa (absolute). Fifteen minutes after the preservative was injected into the vessel a vacuum was again drawn on the vessel. After twenty minutes the pressure vessel had reached a pressure of 25 kPa (absolute). Steam conditioning was now initiated. Steam was slowly admitted into the vessel. When atmospheric pressure was reached the vessel was directly vented to atmosphere so that the internal pressure was held within 5 kPa of atmospheric pressure. This was continued for four hours to increase the moisture content of the wood to 10–12% (oven dry basis). Following completion of the steam conditioning stage the steam was shut off and the vessel opened and the dried, treated wood removed.

The foregoing describes the invention including preferred and particularly preferred forms thereof. Alterations and variations as will be obvious to those skilled in the art are intended to be incorporated in the scope hereof, as defined in the following claims.

We claim:

1. A process for the preservative or remedial treatment of wood or wood based products with a boron based preservative, comprising the steps of drying the wood to a reduced moisture content, subsequently exposing the wood to a vapor or gas of a boron compound whereby an amount of boron or a boron preservative compound effective as a preservative for the wood will become deposited within the wood, and conditioning the wood to raise the moisture content of the wood to a working moisture content therefor.

2. A process as claimed in claim 1, wherein at least the drying and conditioning are carried out in a common treatment vessel.

3. A process as claimed in claim 2, wherein the vapor or gas treatment is also carried out in the common treatment vessel and the vessel is a closed treatment vessel.

4. A process as claimed in claim 3, wherein the vapor or gas treatment is carried out under conditions of reduced pressure.

5. A process as claimed in claim 4, wherein the reduced pressure is less than 30 kPa (absolute).

6. A process as claimed in claim 5, wherein the reduced pressure is less than 15 kPa (absolute).

7. A process as claimed in claim 4, wherein the vapor or gas treatment is carried out under conditions of elevated temperature.

8. A process as claimed in claim 7, wherein the elevated temperature is above 80° C.

9. A process as claimed in claim 7, wherein the wood is dried to a moisture content in the range of 0 to 6% by weight of the dried wood.

10. A process as claimed in claim 9, wherein the wood is dried such that the moisture content of about 90% of the wood is below 6% by weight of the dried wood.

11. A process as claimed in claim 10, wherein the drying comprises drying at a dry bulb temperature of 120° C. and a wet bulb temperature of 70° C.

12. A process as claimed in claim 9, wherein the vapor/gas treatment is carried out when the wood is still hot from drying.

13. A process as claimed in claim 10, wherein the conditioning is carried out by steam conditioning at about atmospheric pressure.

14. A process as claimed claim 13, wherein conditioning is carried out to achieve a moisture content in the processed wood in the range 8 to 12%.

15. A process as claimed in any one of claims 1 to 14, wherein the vapor is created by release of the boron compound in a liquid form into a treatment vessel heated to a temperature and/or reduced to a pressure sufficient to cause the liquid boron compound to vaporise on entry into the vessel and/or contact with the heated vessel walls.

16. A process as claimed in any one of claims 1 to 14, wherein the boron compound comprises trimethyl borate or a mixture of trimethyl borate and methanol.

17. A process as claimed in claim 15 wherein the boron compound comprises trimethyl borate or a mixture of trimethyl borate and methanol.

18. A process for the preservative or remedial treatment of wood or wood based products with a boron based preservative, comprising the steps of placing the wood to be treated in a common treatment vessel, drying the wood to a reduced moisture content of below 10% by weight of the dried wood, subsequently exposing the wood to a vapor of a boron compound under conditions of evacuation of the treatment vessel and elevated temperature in the treatment vessel and for a time sufficient for an amount of boron or a boron preservative compound to become deposited within the wood to an extent sufficient and effective for said boron or boron preservative compound to act as a preservative for the wood, and subsequently exposing the wood within the treatment vessel to steam conditioning thereof to raise the moisture content of the wood to a working moisture content therefor.

19. A process for the preservative or remedial treatment of wood or wood based products with a boron based preservative, comprising the steps of drying the wood to a reduced moisture content, subsequently exposing the wood to a vapor or gas of a boron compound within a closed treatment vessel under pressure conditions within said treatment vessel of less than 30 kPa (absolute) and an elevated temperature of about 80° C. for a time and in an amount sufficient for the boron compound to be deposited into the wood and to be effective as a preservative for the wood, said boron vapor being created by release of the boron compound in a liquid form into the treatment vessel such as said boron compound will vaporise on entry into the vessel or on contact with the heated vessel walls, and subsequently conditioning the wood to raise the moisture content of the wood to a working moisture content therefor.

* * * * *

UNITED STATES PATENT AND TRADEMARK OFFICE
CERTIFICATE OF CORRECTION

PATENT NO. : 5,024,861

DATED : June 18, 1991

INVENTOR(S) : Vinden et al.

It is certified that error appears in the above-identified patent and that said Letters Patent is hereby corrected as shown below:

On the title page:
In the Abstract, line 3, "timer" should read --timber--.
Column 1, after line 3, insert new paragraph --The present invention comprises a timber preservative process.--

Signed and Sealed this

Seventeenth Day of November, 1992

*Attest:*

DOUGLAS B. COMER

*Attesting Officer*

*Acting Commissioner of Patents and Trademarks*